United States Patent [19]

Okanobu

[11] Patent Number: 5,710,997
[45] Date of Patent: Jan. 20, 1998

[54] SUPERHETERODYNE RECEIVER APPARATUS

[75] Inventor: Taiwa Okanobu, Tokyo, Japan

[73] Assignee: Sony Corporation, Tokyo, Japan

[21] Appl. No.: 590,885

[22] Filed: Jan. 24, 1996

[30] Foreign Application Priority Data

Jan. 25, 1995 [JP] Japan ................. 7-028795

[51] Int. Cl.$^6$ ........................... H04B 1/06
[52] U.S. Cl. ................. 455/316; 455/318; 455/304
[58] Field of Search ........................... 455/315, 313, 455/260, 214, 197.1, 316, 302, 304, 314, 318, 323, 317, 307, 324

[56] References Cited

U.S. PATENT DOCUMENTS

| | | | |
|---|---|---|---|
| 4,910,800 | 3/1990 | Chung | 455/315 |
| 4,944,025 | 7/1990 | Gehring et al. | 455/316 |
| 5,263,194 | 11/1993 | Ragan | 455/316 |
| 5,428,836 | 6/1995 | Sanecki et al. | 455/315 |

FOREIGN PATENT DOCUMENTS

| | | | | |
|---|---|---|---|---|
| 305603 | 3/1989 | European Pat. Off. | ......... | H03D 1/22 |
| 305604 | 3/1989 | European Pat. Off. | ......... | H03D 7/16 |

*Primary Examiner*—Amelia Au
*Attorney, Agent, or Firm*—Jay H. Maioli

[57] ABSTRACT

A receiver apparatus comprises a first local oscillator, a first pair of mixer circuits, a second local oscillator, a second pair of mixer circuits, an adding circuit, a bandpass filter and a modulation circuit. When the frequency of a second local oscillating circuit varies, a center frequency of the bandpass filter also varies in the same way so as to eliminate tracking errors. A large portion of a circuit for a double superheterodyne receiver can thus be incorporated in a single IC chip, the receiver may be made simpler, and cheaper, and differences in the absolute values of the capacitors and resistors due to variation in manufacturing processes can be eliminated.

8 Claims, 7 Drawing Sheets

SUPERHETERODYNE RECEIVER APPARATUS

BACKGROUND OF THE INVENTION

This invention relates to a superheterodyne receiver apparatus.

Generally, with superheterodyne receivers, image interference signals are attenuated to levels that do not present problems by setting the first intermediate frequency up to be sufficiently higher than the received frequency and disturbance from neighboring stations is removed by setting the second intermediate frequency so as to be low when compared with the first intermediate frequency.

However, when the first and second intermediate frequencies are set-up in this way, the second locally oscillated frequency is high and if the frequency precision of the second locally oscillated frequency is not high, tracking errors will be caused in the received frequency.

In order to prevent this, the second locally oscillated signal may be formed using a crystal oscillating circuit. However, another crystal oscillating circuit is also necessary because the first locally oscillated signal is formed using a PLL. This means that two crystal oscillating circuits are necessary, which will raise costs.

There are also methods where the oscillated frequency for the crystal oscillating circuit of the PLL forming the first locally oscillated signal is multiplied to form the second locally oscillated signal. However, in this case, a bandpass filter is necessary to extract only the necessary frequency for the second locally oscillated signal from the output signal of the multiplying circuit, which prevents the receiver from being small. Spurious disturbance characteristics must also be considered, which causes further problems with system design.

Since the first intermediate frequency becomes high, if the second locally oscillated signal is generated by a crystal oscillating circuit or by multiplication, the first intermediate frequency becomes high and the first intermediate frequency filter cannot be put into IC form.

It is therefore the object of the present invention to resolve the kind of problems described above.

SUMMARY OF THE INVENTION

In order to resolve these problems, a receiver apparatus comprises a first local oscillator, a first pair of mixer circuits, a second local oscillator, a second pair of mixer circuits, an adding circuit, a bandpass filter and a modulation circuit. The first local oscillator generates a pair of first locally oscillated signals that are out of phase with each other by ninety degrees. The first pair of mixer circuits mix a received signal having a high frequency with the pair of first locally oscillated signals to produce a pair of first intermediate frequency signals having a relatively low frequency. The second local oscillator generates a pair of second locally oscillated signals that are out of phase with each other by ninety degrees. The second pair of mixer circuits mix the pair of first intermediate frequency signals with the pair of second locally oscillated signals, respectively, to produce a pair of second intermediate frequency signals having a predetermined frequency. The adding circuit adds the pair of second intermediate frequency signals to each other. The bandpass filter receives an output signal from the adding circuit. The demodulation circuit reproduces the original signal of the received signal from the output of the bandpass filter. The second local oscillating means has a capacitor and a resistor determining the second intermediate frequency and the bandpass filter has a capacitor and a resistor determining a center frequency thereof.

The demodulating circuit may be an FM demodulating circuit and a center frequency of the demodulating circuit may be determined by a capacitor and a resistor.

Further, the capacitor and resistor determining a second locally oscillated frequency and the capacitor and resistor determining the center frequency of the bandpass filter are incorporated in a single IC chip.

Moreover, the capacitor and resistor determining the second locally oscillated frequency, the capacitor and resistor determining the center frequency of the bandpass filter, and the capacitor and resistor determining the central frequency of the demodulating circuit are incorporated in a single IC chip.

Here, change in the receiving frequency is carried out in accordance with change in a frequency of the first locally oscillated signal.

Still further, the first local oscillator may be constructed from a phase-locked loop, and an auto-frequency control circuit may be provided for auto-frequency controlling the second local oscillating frequency.

In this apparatus, when the second locally oscillated frequency of the second local oscillating circuit varies, the center frequency of the bandpass filter also varies in the same way so as to eliminate tracking errors.

DETAILED DESCRIPTION OF THE PREFERRED EMBODIMENT

Overall Configuration

Figure 1:
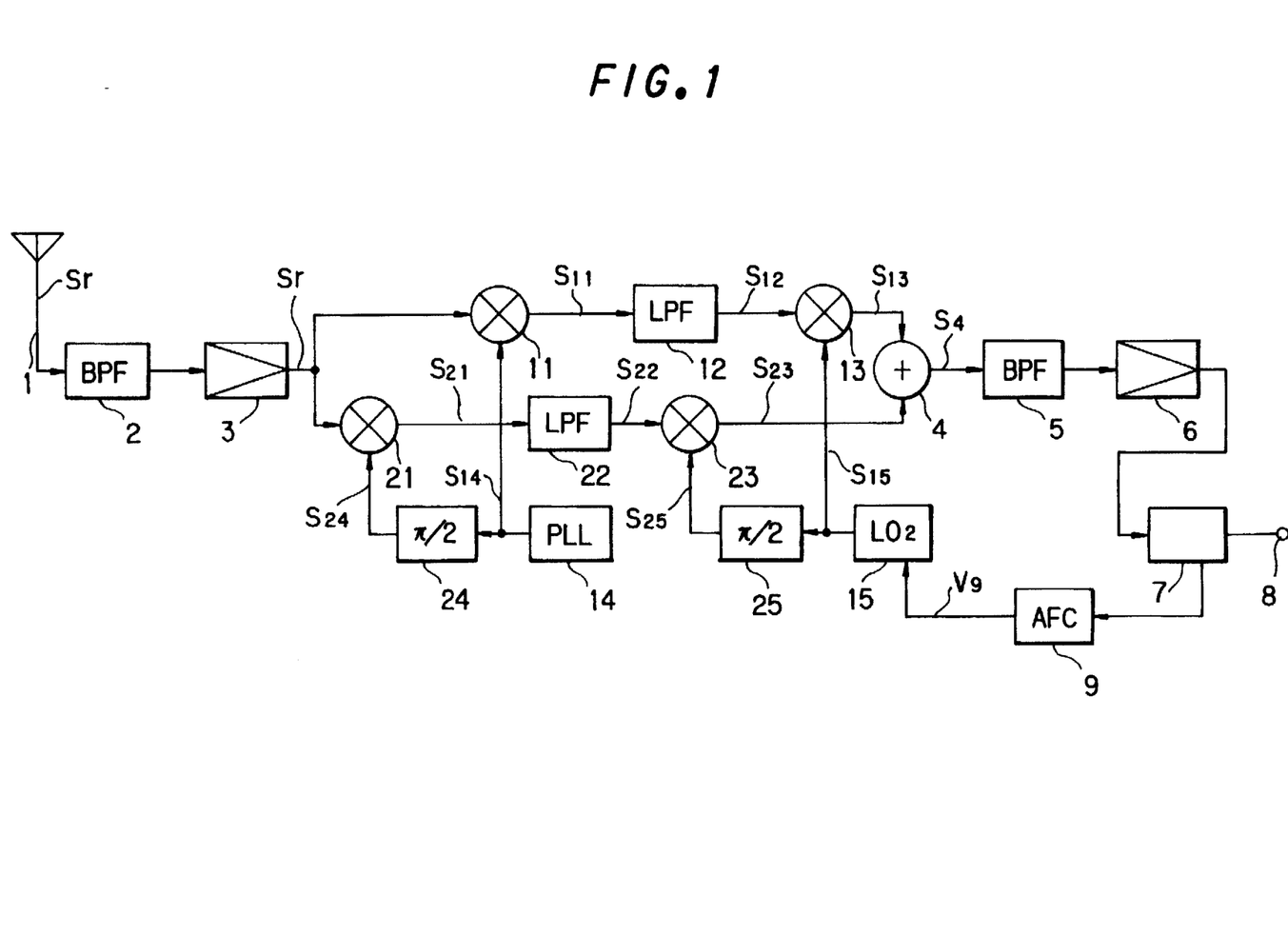
FIG. 1 is a block diagram showing a circuit configuration of an embodiment of the present invention.

FIG. 1 shows the present invention applied to a receiver circuit for a base unit and a handset of a cordless telephone having an FM signal as the receiving signal. The FM signal Sr is received by an antenna 1 and is supplied to first mixer circuits 11 and 21 for orthogonal conversion to an I-axis and a Q axis via a bandpass filter 2 for preselector use and a high-frequency amplifier 3.

A PLL 14 is provided as the first locally oscillated circuit. The PLL 14 provides an output of an oscillated signal S14 of a frequency equal to the carrier frequency of the receiving signal Sr. The signal S14 is provided to the mixer circuit 11 as a first locally oscillated signal and is also provided to a phase-shifting circuit 24 to be phase-shifted by just $\pi/2$, and a phase-shifted signal S24 is Generated. The phase-shifted signal S24 is then provided to the first mixer circuit 21 as the first locally oscillated signal.

Figure 2A:
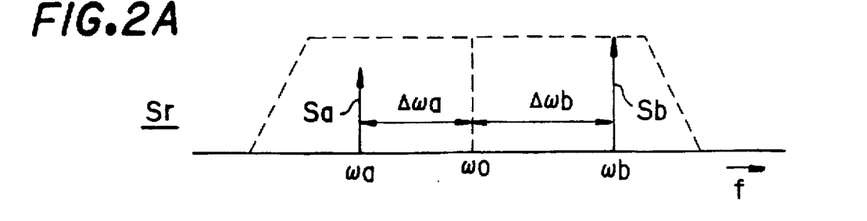
FIG. 2A and FIG. 2B are views illustrating the operation of the circuit of FIG. 1.

The received signal Sr, as shown in FIG. 2A, has a signal component Sa within the lower sideband and a signal component Sb within the upper sideband. Further, if we let $\omega o$: the carrier frequency (angular frequency) of the received signal Sr $\omega a$: angular frequency of signal component Sa. $\omega a < \omega o$ Ea: amplitude of signal component Sa $\omega b$: angular frequency of signal component Sb. $\omega b > \omega o$ Eb: amplitude of signal component Sb $$\Delta \omega a = \omega o - \omega a$$

$$\Delta \omega b = \omega b - \omega o,$$

then, $$Sr = Sa + Sb$$

$$Sa = Ea \cdot \sin \omega a t$$

$$Sb + Eb \cdot \sin \omega b t.$$

Further, if we let

E1: the amplitude of the first locally oscillated signals S14 and S24, then $$S14 = E1 \cdot \sin \omega o t$$

$$S24 = E1 \cdot \cos \omega o t.$$

Therefore, if we let

S11, S12: output signals of the mixer circuits 11 and 21, then,

| S11 | = | $Sr \cdot S14$ |
| --- | --- | --- |
| | = | $(Ea \cdot \sin \omega a t + Eb \cdot \sin \omega b t) \times E1 \cdot \sin \omega o t$ |
| | = | $\alpha a\{-\cos(\omega a + \omega o)t + \cos(\omega o - \omega a)t\} +$ |
| | | $\alpha b\{-\cos(\omega b + \omega o)t + \cos(\omega b - \omega o)t\}$ |
| | = | $\alpha a\{-\cos(\omega a + \omega o)t + \cos\Delta\omega a t\} +$ |
| | | $\alpha b\{-\cos(\omega b + \omega o)t + \cos\Delta\omega b t\}$ |
| S21 | = | $Sr \cdot S24$ |
| | = | $(Ea \cdot \sin \omega a t + Eb \cdot \sin \omega b t) \times E1 \cdot \cos \omega o t$ |
| | = | $\alpha a\{\sin(\omega a + \omega o)t - \sin(\omega o - \omega a)t\} +$ |
| | | $\alpha b\{\sin(\omega b + \omega o)t + \sin(\omega b - \omega o)t\}$ |
| | = | $\alpha a\{\sin(\omega a + \omega o)t - \sin\Delta\omega a t\} +$ |
| | | $\alpha b\{\sin(\omega b + \omega o)t + \sin\Delta\omega b t\}$ | where $$\alpha a = Ea \cdot E1/2$$

$$\alpha b = Eb \cdot E1/2.$$

Of the above equations, the signal components for the angular frequencies $\Delta \omega a$ and $\Delta \omega b$ are the required intermediate frequencies. The signals S11 and S21 are provided to the low pass filters 12 and 22, the signal components for the angular frequencies $\Delta \omega a$ and $\Delta \omega b$ are being obtained as the first intermediate frequency signals S12 and S22. The signals S12 and S22 are expressed by the following equations.

$$S12 = \alpha a \cdot \cos \Delta \omega a t + \alpha b \cdot \cos \Delta \omega b t$$

$$S22 = -\alpha a \cdot \sin \Delta \omega a t + \alpha b \cdot \sin \Delta \omega b t.$$

In this case, as becomes clear from the above equations and FIG. 2A, the signals S12 and S22 are baseband signals.

Further, these signals S12 and S22 are respectively provided to second mixer circuits 13 and 23 for I-axis and Q-axis orthogonal conversion. A second locally oscillated signal S15 of a comparatively low frequency from the second local oscillating circuit 15 is provided to the second mixer circuit 13. The signal S15 is also provided to the phase-shifting circuit 25, phase-shifted by $\pi/2$, and a phase-shifted signal S25 is generated. The phase-shifted signal S25 is then provided to the second mixer circuit 23 as a second locally oscillated signal.

If we let $$S15 = E2 \cdot \sin \omega s t$$

$$S25 = E2 \cdot \cos \omega s t$$

E2: amplitude of second locally oscillated signals S15 and S25

$\omega = 2\pi f s$ being, for example, 55 kHz, and

S13, S14: output signals for second mixer circuits 13 and 23, then, S13 and S14 are represented by the following expressions.

| S13 | = | $S12 \cdot S15$ |
| --- | --- | --- |
| | = | $(\alpha a \cdot \cos\Delta\omega a t + \alpha b \cdot \cos\Delta\omega b t) \times E2 \cdot \sin\omega s t$ |
| | = | $\beta a\{\sin(\Delta\omega a + \omega s)t - \sin(\Delta\omega a - \omega s)t\} +$ |
| | | $\beta b\{\sin(\Delta\omega b + \omega s)t - \sin(\Delta\omega b - \omega s)t\}$ |
| S23 | = | $S22 \cdot S25$ |
| | = | $(-\alpha a \cdot \sin\Delta\omega a t + \alpha b \cdot \sin\Delta\omega b t) \times E2 \cdot \cos\omega s t$ |
| | = | $-\beta a\{\sin(\Delta\omega a + \omega s)t + \sin(\Delta\omega a - \omega s)t\} +$ |
| | | $\beta b\{\sin(\Delta\omega b + \omega s)t + \sin(\Delta\omega b - \omega s)t\}$ |
| $\beta a$ | = | $\alpha a \cdot E2/2$ |
| $\beta b$ | = | $\alpha b \cdot E2/2.$ |

Then, with regards to these signals S13 and S23, the signals S13 and S23 are transformed as follows so that the value for the frequency difference does not become negative.

| S13 | = | $\beta a\{\sin(\Delta\omega a + \omega s)t + \sin(\omega s - \Delta\omega a)t\} +$ |
| --- | --- | --- |
| | | $\beta b\{\sin(\Delta\omega b + \omega s)t + \sin(\omega s - \Delta\omega b)t\}$ |
| | = | $\beta a \cdot \sin(\omega s + \Delta\omega a)t + \beta a \cdot \sin(\omega s - \Delta\omega a)t +$ |
| | | $\beta b \cdot \sin(\omega s + \Delta\omega b)t + \beta b \cdot \sin(\omega s - \Delta\omega b)t$ |
| S23 | = | $-\beta a\{\sin(\Delta\omega a + \omega s)t - \sin(\omega s - \Delta\omega a)t\} +$ |
| | | $\beta b\{\sin(\Delta\omega b + \omega s)t - \sin(\omega s - \Delta\omega b)t\}$ |
| | = | $-\beta a \cdot \sin(\omega s + \Delta\omega a)t + \beta a \cdot \sin(\omega s - \Delta\omega a)t +$ |
| | | $\beta b \cdot \sin(\omega s \cdot \Delta\omega b)t - \beta b \cdot \sin(\omega s - \Delta\omega b)t.$ |

The signals S13 and S23 are then provided to an adding circuit 4, added, and a signal S4 expressed by the following equation is obtained from the adding circuit 4.

$$S4 = S13 + S23$$

$$= 2\beta a \cdot \sin(\omega s - \Delta\omega a)t + 2\beta b \cdot \sin(\omega s + \Delta\omega b) t$$

Figure 2B:
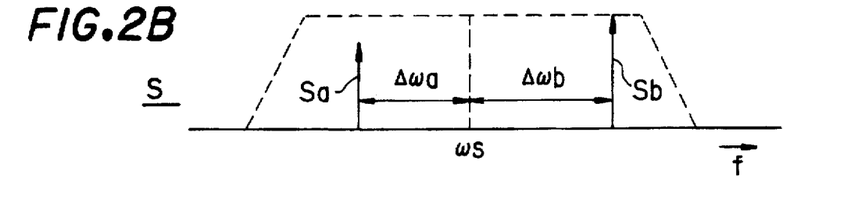

The component of the added signal S4 is as illustrated in FIG. 2B. The signal S4 is a signal for which the frequency of the received signal Sr is converted to the carrier frequency (angular frequency) $\omega$. That is, the signal S4 is the second intermediate frequency signal with the intermediate frequency fs.

This second intermediate frequency signal S4 is provided to the FM demodulating circuit 7 via a bandpass filter 5 for intermediate frequency use and a limiter amplifier 6 and demodulated to be an original audio signal, which is outputted from an audio signal end 8.

At this time, the demodulated output of the demodulating circuit 7 is provided to an AFC (auto frequency control) voltage-producing circuit 9, and an AFC voltage V9 is generated. The AFC voltage V9 is provided to the second locally oscillated circuit 15 as a control signal of the second locally oscillated frequency, and AFC is performed.

At the adding circuit 4, by performing subtraction of the signals S13 and S23 instead of addition, a signal Simg expressed by the following equation is generated:

$$Simg = S13 - S23$$

$$= 2\beta a \cdot \sin(\omega s + \Delta \omega a)t + 2\beta b \cdot \sin(\omega s - \Delta \omega b)t.$$

The signal Simg is a disturbance signal distributed in a state that the frequency spectrum of the signal S4 is inverted at the frequency band occupied by the original second intermediate frequency signal S4. That is, the signal Simg is an image disturbance signal.

Usually, at an FM receiver, this intermediate frequency is 10.7 MHz and the intermediate frequency filter is constructed from a ceramic filter and therefore cannot be put into IC form.

In the above receiver, however, the first intermediate frequency signals S12 and S22 are baseband signals, and the second intermediate frequency fs can therefore be made to be as low as, for example, 55 kHz or less. Hence, the filters 12, 22 and 5 can be constructed from active filters having resistors, capacitors and amplifiers. This allows a signal line from the high-frequency amplifier 3 to the demodulating circuit 7 to be integrated into a single chip or monolithic IC including filters 12, 22 and 5.

However, with just the above construction, if there is shifting of the oscillated frequency fs of the second local oscillating circuit 15, the center frequency of the bandpass filter 5 and the center frequency of the demodulation characteristics (S characteristics) of the demodulating circuit 7, tracking errors are caused at the received frequency.

In the present invention, the second local oscillating circuit 15, the bandpass filter 5 and the demodulating circuit 7 are therefore constructed using circuits whose oscillated frequencies or central frequencies are decided by used capacitors and resistors.

Case for Second Local Oscillating Circuit 15

Figure 3:
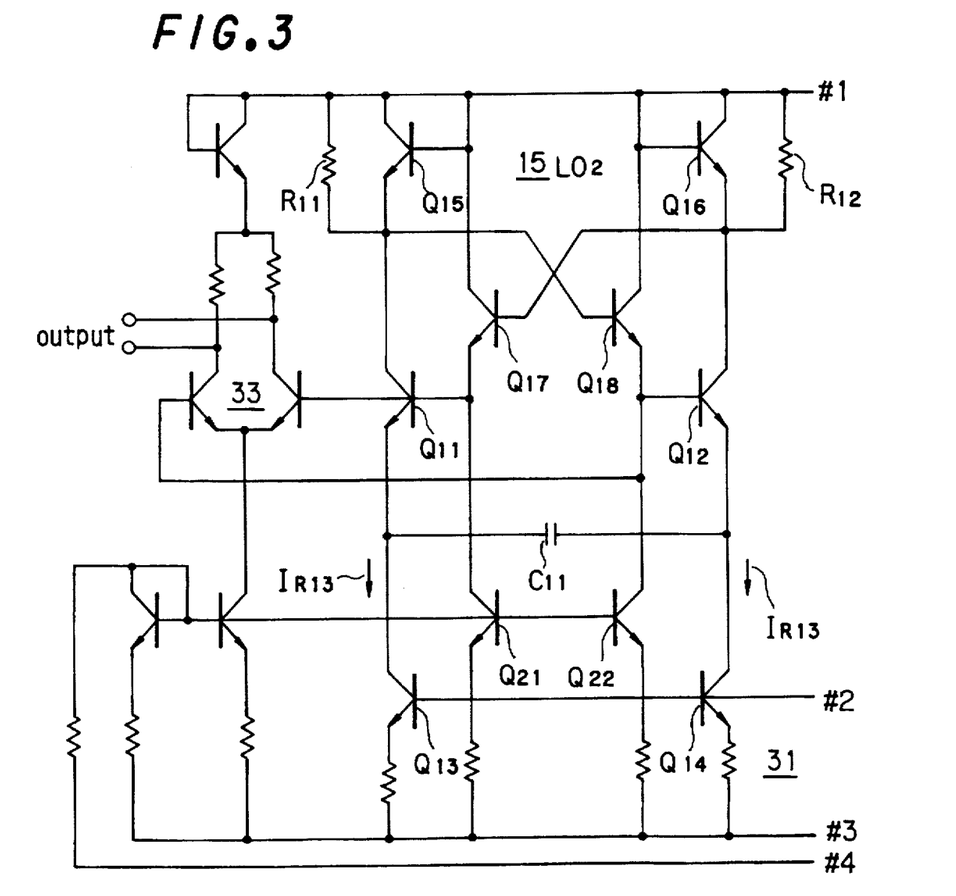
FIG. 3 is a connection diagram showing an example of a part of the circuit of FIG. 1.
Figure 4:
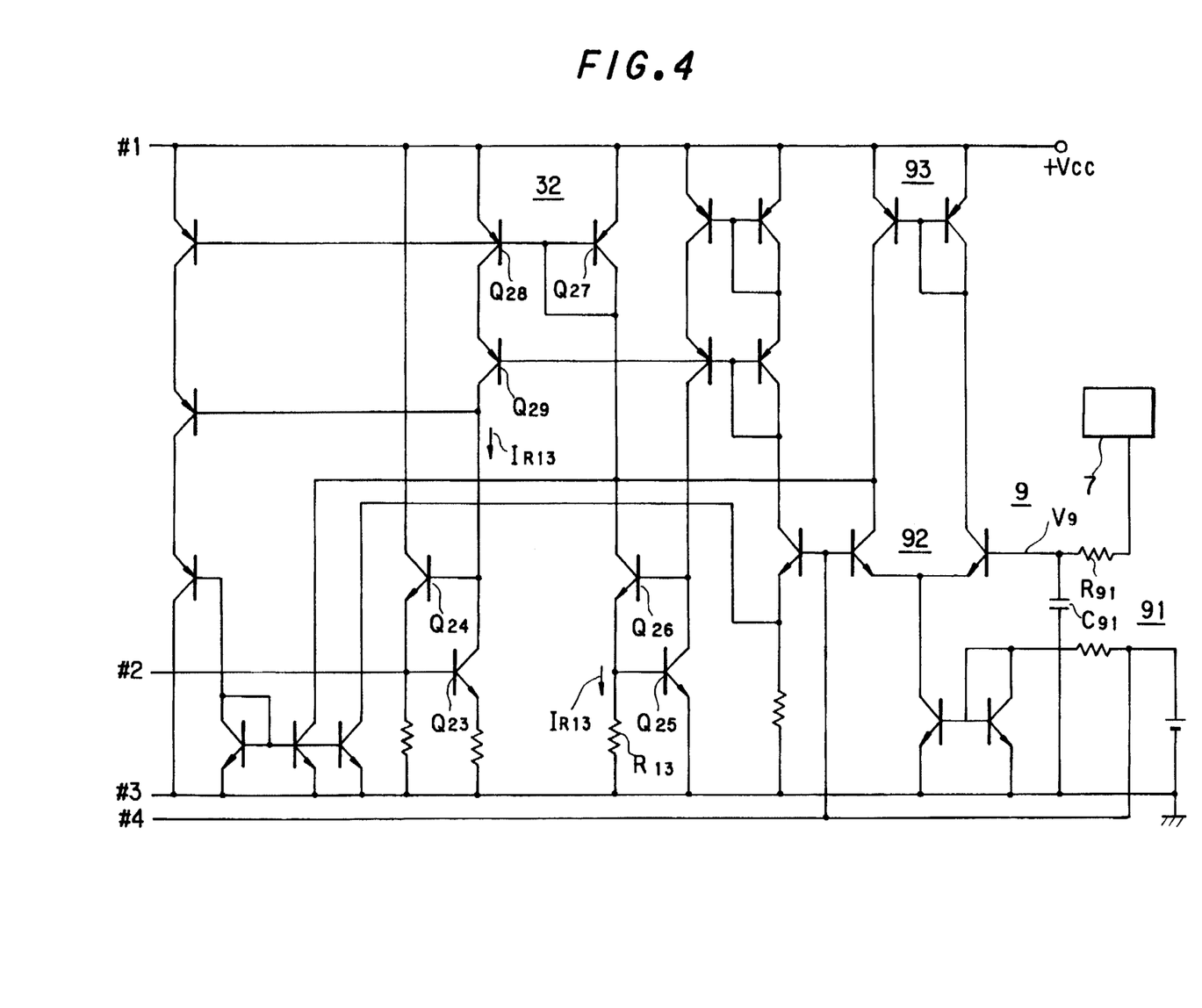
FIG. 4 is a connection diagram showing a continuation of the example of FIG. 3.

FIG. 3 and FIG. 4 show a divided-up example of a second local oscillating circuit 15 composed in this way, with lines designated by #1 to #4 of FIG. 3 and lines designated by #1 to #4 of FIG. 4 being respectively connected. In this example, the oscillating circuit 15 is composed of an emitter-coupled monostable multivibrator.

At the second local oscillating circuit 15, a capacitor C11 is connected between the emitters of transistors Q11 and Q12, with these emitters being connected to the collectors of transistors Q13 and Q14 for constant-current source use. The collectors of the transistors Q11 and Q12 are then connected to the power supply line via a parallel circuit of diode-connected transistors Q15 and Q16 and resistors R11 and R12.

Transistors Q17 and Q18 are taken as emitter followers by transistors Q21 and Q22 for constant current supply use and the collectors of the transistors Q11 and Q12 are connected to the bases of transistors Q12 and Q11 via transistors Q18 and Q17.

The transistors Q13 and Q14 form a current mirror circuit 31 together with transistors Q23 and Q24. Transistor Q23 is the input side transistor, transistors Q13 and Q14 are the output side transistors and transistor Q24 is a bias transistor.

The emitter of transistor Q25 is grounded, a resistor R13 is connected between the base of transistor Q25 and ground, and the base and emitter of transistor Q26 are connected between the collector and base of transistor Q25.

A current mirror circuit 32 is composed of transistors Q27 and Q28. The collector of transistor Q26 is connected to the collector of transistor Q27, and the collector of transistor Q28 is connected to the collector of transistor Q23 via the emitter and collector of transistor Q29.

Therefore, if we let

VBE25: base-emitter voltage of transistor Q25
IR13: current flowing through resistor R13 then, $$IR13 = VBE25/R13.$$

The current IR13 is equal to the collector current of the transistor Q27. As transistors Q27 and Q28 form the current mirror circuit 32, the collector current of transistor Q28 is equal to the current IR13.

The collector current of transistor Q28 is also equal to the collector current of transistor Q23 and as transistors Q23, Q24, Q13 and Q14 form a current mirror circuit, the collector currents of transistors Q13 and Q14 are equal to the current IR13.

Figure 5:
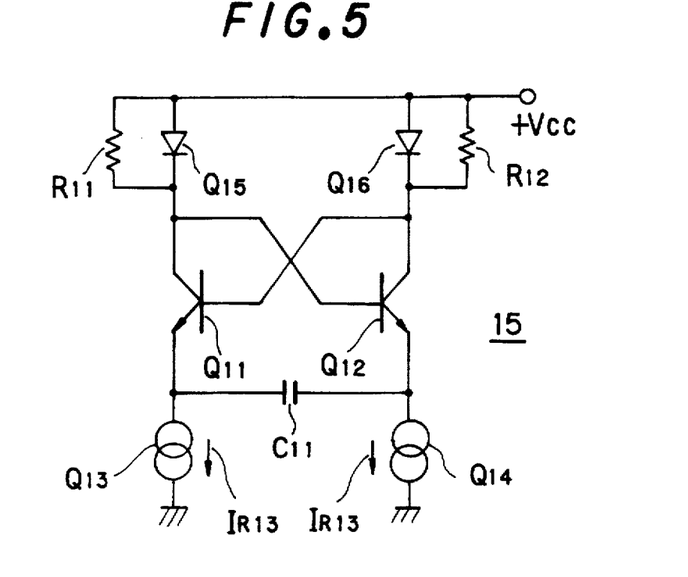
FIG. 5 is an equivalent circuit diagram of the circuit of FIG. 3.
Figure 6:
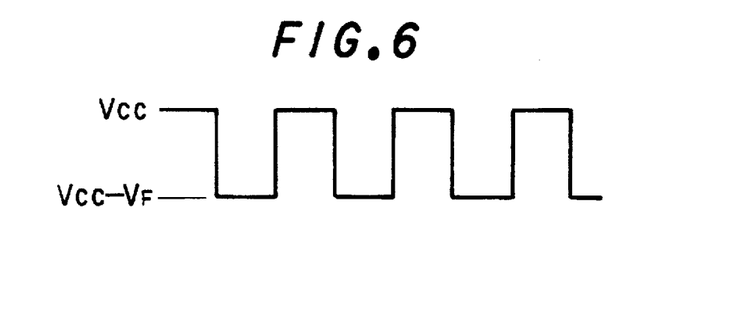
FIG. 6 is a waveform chart illustrating the operation of the circuit of FIG. 5.

FIG. 5 shows this oscillating circuit 15 displayed as an equivalent circuit. A pulse voltage having a duty ratio of 50% is outputted from the collectors of transistors Q11 and Q12 as shown in FIG. 6, where VF: base emitter voltage of transistors Q15 and Q16.

This output pulse voltage is provided to a frequency dividing circuit (not shown in the drawings) via a differential amplifier 33 and is frequency divided into a signal of frequency fs. This frequency divided signal is provided to the second mixer circuit 13 as the second locally oscillated signal S15 which becomes the phase-shifted signal S25 via the phase-shifting circuit 25, and is provided to the second mixer circuit 23 as the second locally oscillated signal.

In this case, the oscillated frequency f15 of the oscillating circuit 15 is expressed as follows:

$$f15 = IR13/(4VFC11).$$

Then, as described above, $$IR13 = VBE25/R13$$

and

VF=VBE25.

The oscillated frequency f15 may therefore be expressed in the following way:

$$f15 = (VBE25/R13)/(4VFC11) = 1/(4C11R13) \qquad (1).$$

Thus, the oscillated frequency f15 of the oscillating circuit 15 is decided by capacitance of the capacitor C11 and resistance of the resistor R13.

At this time, the AFC voltage-producing circuit 9 in this embodiment is composed as follows. That is, the demodulated output of the demodulating circuit 7 is provided to a low-pass filter 91 having a resistor 91 and a capacitor C91 and an AFC voltage V9 is extracted, which is provided to a differential amplifier 92. This differential amplifier 92 has the current mirror circuit 93 as a load and the output current of this differential amplifier 92 is provided to the collector of the transistor Q25.

If the oscillated frequency f15 of the second local oscillating circuit 15 fluctuates, the intermediate frequency of the second intermediate frequency signal S4 fluctuates and the AFC voltage V9 changes. The output currents of the differential amplifier 92 and the current mirror circuit 93 therefore also change in accordance with fluctuations in the oscillated frequency f15.

The magnitude of the collector current of the transistor Q25 varies in accordance with fluctuations in the oscillated frequency f15. The collector currents of transistors Q13 and Q14 therefore also change accordingly so that fluctuations in the oscillated frequency f15 are canceled out, i.e. AFC is performed.

The Case for Bandpass Filter 5

Figure 7:
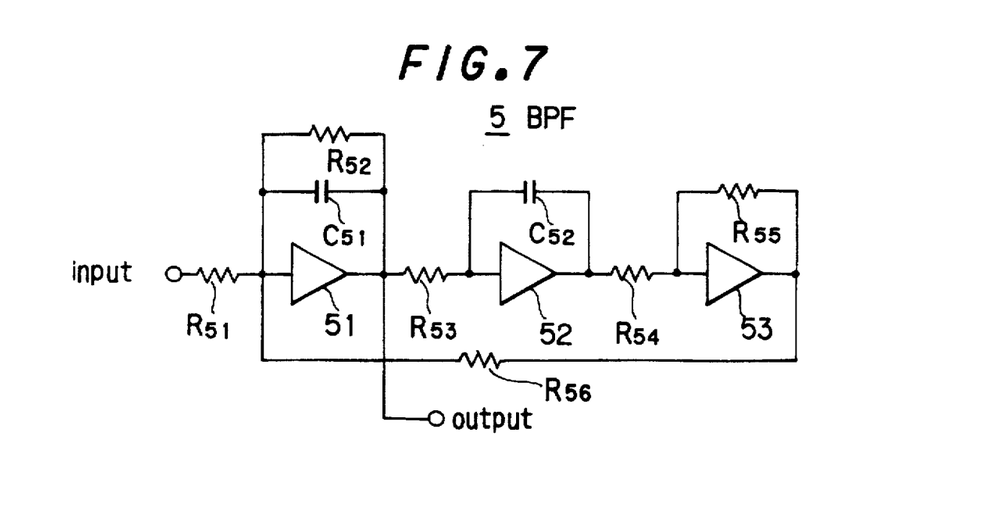
FIG. 7 is a connection diagram showing an example of another part of the circuit of FIG. 1.

FIG. 7 shows an example of a bandpass filter 5 for use as the second intermediate filter. This bandpass filter 5 is, for example, a biquad active filter.

At the bandpass filter 5, the second intermediate frequency signal S4 from the adding circuit 4 is provided to an input end of a phase-inverting-type operational amplifier 51 via a resistor 51 and provided to a resistor R52 and a capacitor C51 connected in parallel between the input end and the output end of the operational amplifier 51. The output of the amplifier 51 is provided to the input end of the phase-inverting-type operational amplifier 52 via a resistor R53 and provided to a capacitor 52 connected between the output end and input end of the operational amplifier 52.

The output of the amplifier 52 is provided to the input end of a phase-inverting-type operational amplifier 53 via a resistor R54 and provided to a resistor R55 connected between the output end and the input end of the operational amplifier 53. Moreover, a resistor R56 is connected between the output end of the amplifier 53 and the input end of the amplifier 51, with the output end of the amplifier 51 being connected to the input end of the next stage.

For simplicity, if we let

R54=R55 and let the gain of the amplifier 53 be −1, the center frequency f5 of the bandpass filter 5 can be expressed as follows:

$$f5 = 1/\{2\pi(C51 C52 R53 R56)^{**}0.5\}$$

(where X**0.5 indicates the value X to the power of 1/2). Further, if we let

R53=R56=R5
C51=C52=C5, then the central frequency f5 may be expressed as follows:

$$f5 = 1/(2\pi C5 R5) \quad (2).$$

The center frequency f5 of the bandpass filter 5 of FIG. 7 is decided by capacitance of a capacitor and resistance of a resistor.

Case for Demodulating Circuit 7

Figure 8:
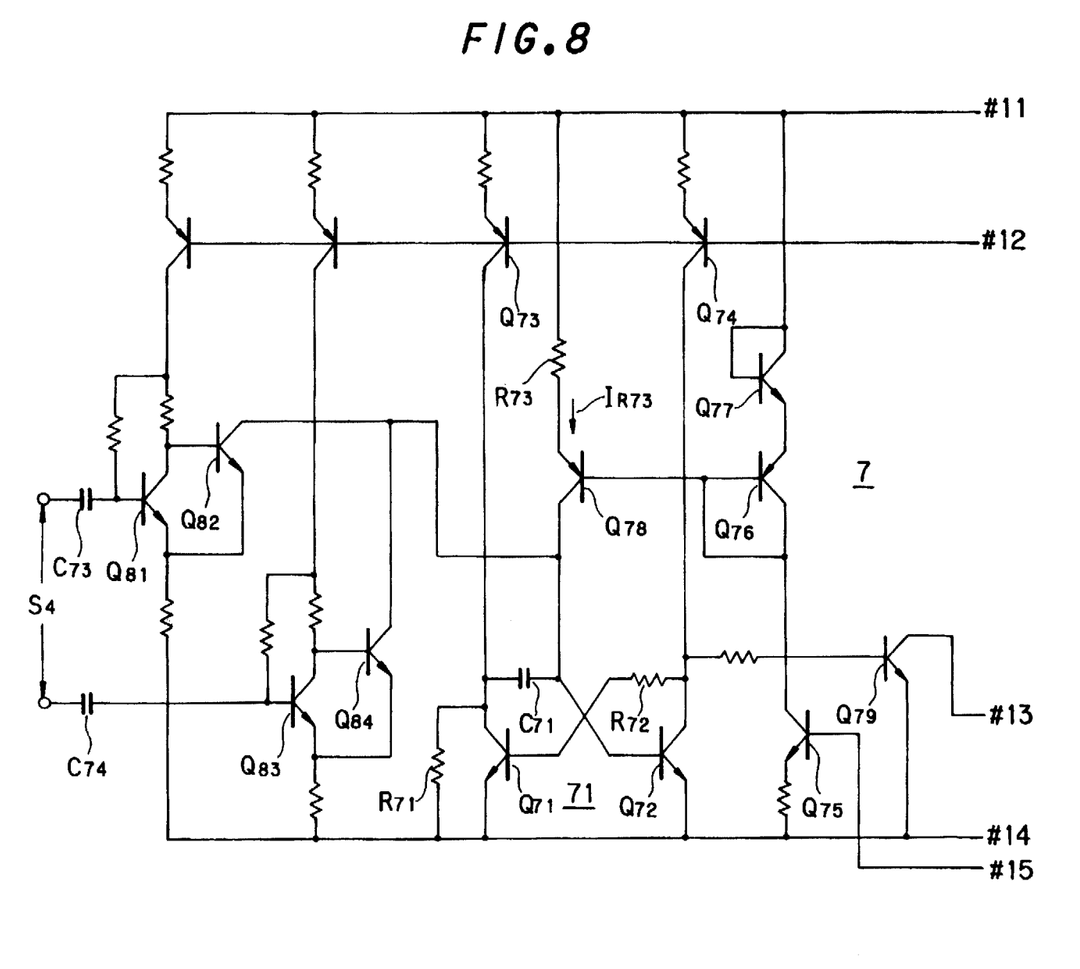
FIG. 8 is a connection diagram showing an example of a further part of the circuit of FIG. 1.
Figure 9:
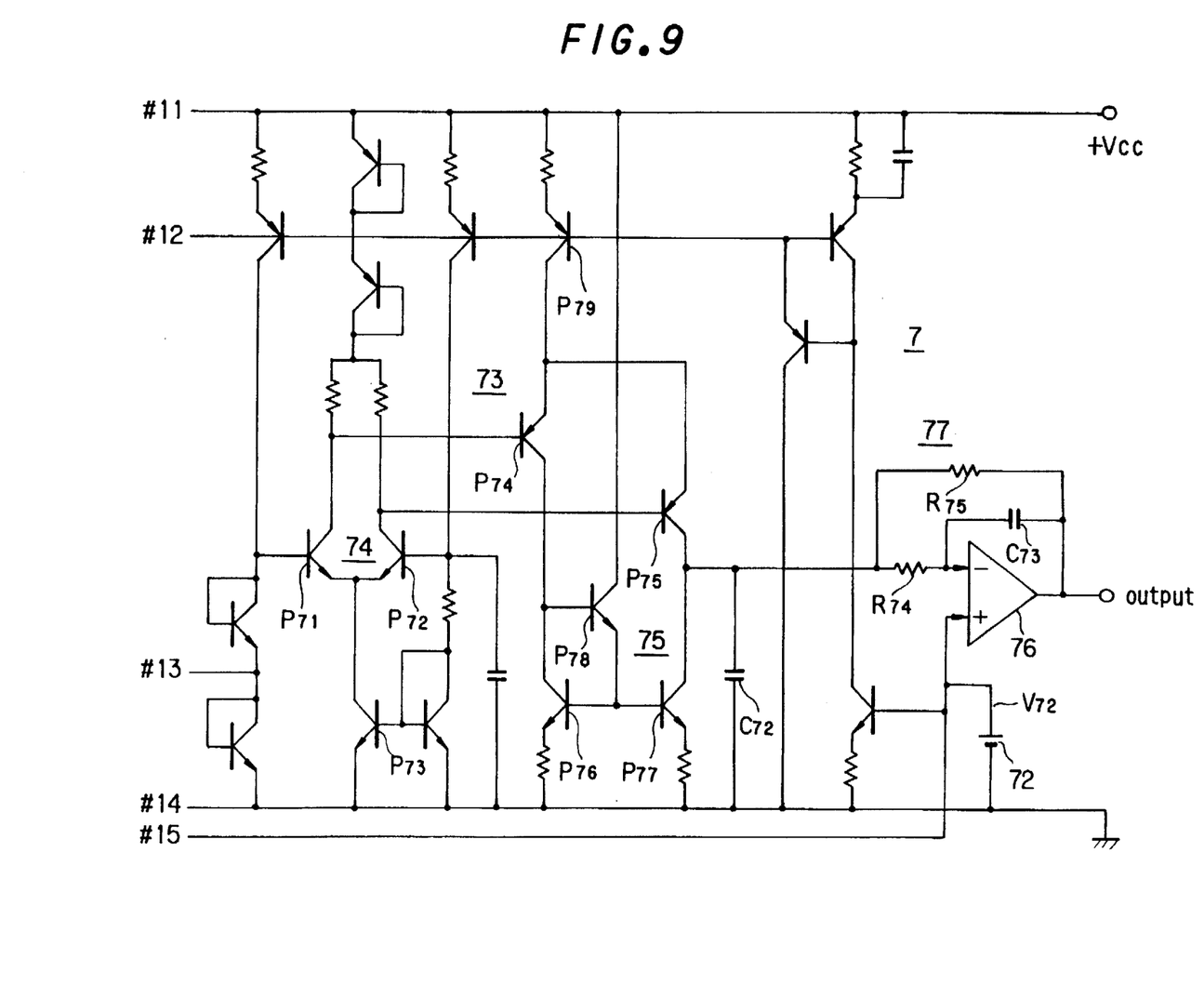
FIG. 9 is a connection diagram showing a continuation of the example of FIG. 8.

An example of the demodulating circuit 7 is shown as being divided into FIG. 8 and FIG. 9, with the lines denoted by #11 to #15 of FIG. 8 and the lines denoted by #11 to #15 of FIG. 9 being connected. In this example, this demodulating circuit 7 is of a pulse-counting-type employing a monostable multivibrator 71.

At the demodulating circuit 7, the emitters of transistors Q71 and Q72 are connected to ground and the collectors thereof are connected to transistors Q73 and Q74 for use as constant current sources. The collector of transistor Q71 is also grounded via resistor R71 and further connected to the base of transistor 72 via a capacitor C71. The collector of transistor Q72 is connected to the base of Q71 via a resistor R72.

A transistor Q75 has a base receiving a fixed bias voltage V72 from a reference voltage source 72 and a collector connected to a voltage source (+Vcc) via a series circuit of diode-connected transistors Q76 and Q77. A transistor Q78 has a base connected to the collector of the transistor Q75, a collector connected to the base of the transistor Q72 and an emitter connected to the voltage source (+Vcc) via a resistor R73.

In this way, a monostable multivibrator 71 is composed.

Figure 10A:
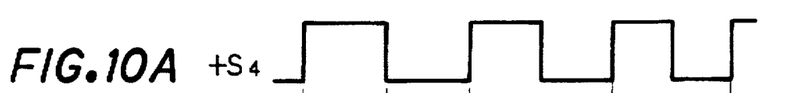
FIGS. 10A through 10F are waveform charts illustrating the operation of the circuit of FIG. 8 and FIG. 9.
Figure 10B:
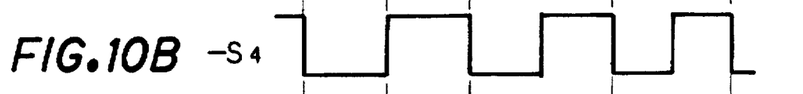
Figure 10C:
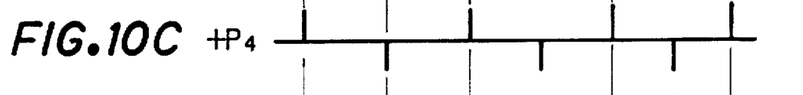
Figure 10D:
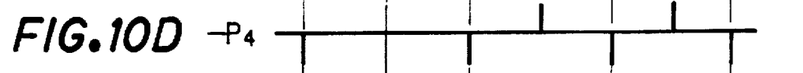

As shown in FIG. 10A and FIG. 10B, rectangular second intermediate frequency signals ±S4 are outputted from a limiter amplifier 6. These signals ±S4 are differentiated by capacitors C73 and C74 to generate pulses ±P4 at every rising and falling edge of these signals ±S4 as shown in FIG. 10C and FIG. 10D. These differentiated pulses ±P4 are provided to transistors Q81 and Q83, which are alternately turned off at every falling of these pulses.

The outputs of transistors Q81 and Q83 are provided to the bases of transistors Q82 and Q84. The transistors Q82 and Q84 are connected in a wired-or form, with this or output being provided to the base of transistor Q72.

Figure 10E:
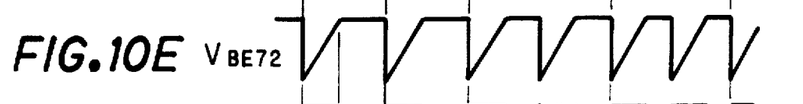

The capacitor C71 therefore discharges each time the transistors Q82 and Q84 are turned on, and when transistors Q82 and Q84 are turned off, the capacitor C71 is charged by a constant current due to the collector current of transistor Q78. A saw-tooth voltage VBE72 as shown in FIG. 10E is therefore generated at the base of transistor Q72. The maximum value of this saw-tooth voltage VBE72 is limited by the forward voltage across the base and emitter of transistor Q72.

Figure 10F:
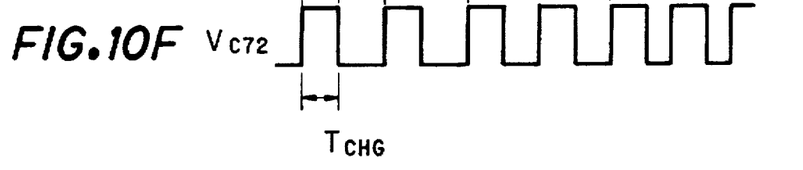

The base voltage of the transistor Q72 changes and in this way generates the pulse voltage VC72 as shown in FIG. 10F at the collector of the transistor Q72. In this case, the period of the saw-tooth voltage VBE72 is equal to the period of the second intermediate frequency signals ±S4. Further, the inclined portion of the voltage VBE72 rises at a constant speed due to capacitor C71 being charged by a constant current so that the period TCHG of this inclined portion is constant. The duty ratio of the pulse voltage VC72 therefore changes so as to correspond to the frequency of the second intermediate frequency ±S4.

This pulse voltage VC72 is provided to a current switch circuit 73 via transistor Q79. At the current switch circuit 73, transistors P71 and P72 form a differential amplifier 74 together with a transistor P73 that serves as a constant current source and are alternately turned on and off in opposite phases due to the pulse voltage VC72.

The collector outputs of transistors P71 and P72 are connected to the bases of transistors P74 and P75, with their collectors being connected to the collectors of transistors P76 and P77. These transistors P76 and P77 form a current mirror circuit 75 together with transistor P78. The transistor P76 is the input side transistor, transistor P77 is the output side transistor and transistor P78 is the bias transistor. The emitters of transistors P74 and P75 are connected to the collector of transistor P79, which is used as a constant current source.

A capacitor C72 is connected to the collectors of transistors P75 and P77 and a secondary low-pass filter for integration is formed with capacitors C72 and C73, resistors R74 and R75 and the operational amplifier 76.

For the operation of the current switch circuit 73, when the transistor P71 is turned off and the transistor P72 is turned on the transistor P74 is turned off and the transistor P75 is turned on due to the pulse voltage VC72. Further, transistor P76 is turned off and transistor P77 is turned off due to transistor P74 being turned off. The capacitor C72 is therefore charged via transistor P75.

Conversely, when the transistor P71 is turned on and the transistor P72 is turned off, transistor P74 is turned on and transistor P75 is turned off due to pulse voltage VC72. Further, transistor P76 is turned on and transistor P77 is turned on due to transistor P74 being turned on. The capacitor C72 is therefore discharged via transistor P77.

Since the capacitor C72 is charged and discharged in accordance with the pulse voltage VC72, the integrated value of the pulse voltage VC72, i.e. an audio signal voltage, which is the FM modulated second intermediate frequency S4 by a pulse count method, is obtained at the capacitor C72.

This capacitor C72, however, is actually a part of the low-pass filter 77. The integration operation is therefore performed by the whole of the filter 77, with the FM-modulated audio signal being extracted from the filter 77.

Figure 11:
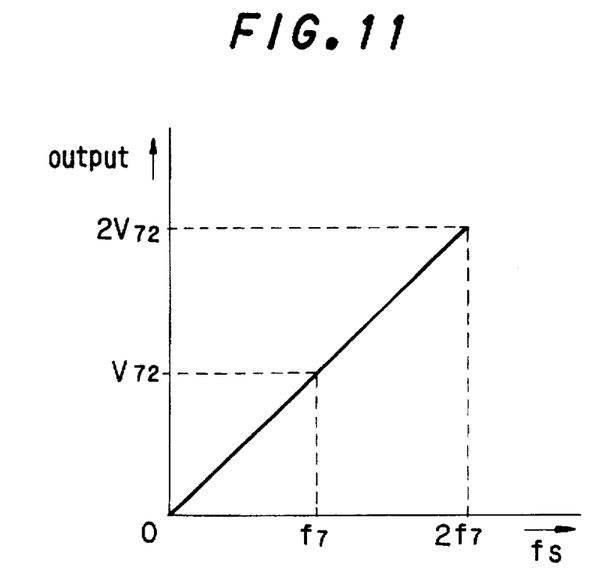
FIG. 11 is a graph showing the operation characteristic of the circuit of FIG. 8 and FIG. 9.

FIG. 11 shows the characteristic of demodulated output voltage with respect to the frequency fs of the input signal (second intermediate frequency S4).

The dynamic range becomes maximum when the relationship between the central frequency f7 of the demodulation characteristic of the demodulating circuit 7 and the charging period TCHG (see FIG. 10) is as follows:

$$f7=1/(2TCHG).$$

The charging current I71 of the capacitor C71 in the period TCHG is expressed as $$TCHG=C71VBE72/I71,$$

then, the frequency f7 becomes as shown in the following:

$$f7=I71/(2C71VBE72).$$

On the other hand, at this demodulating circuit 7, the base-emitter voltage of transistor Q78 and the base-emitter voltage of transistor Q76 are equal and a voltage equal to the voltage across the base and emitter of transistor Q77 is therefore applied to the resistor R73.

Therefore, the relationship between the base-emitter voltage VBE77 of transistor Q77 and the current IR73 flowing through resistor R73 is $$IR73=VB77/R73,$$

and this current IR73 is also the collector current of transistor Q78. Further, this current IR73 is also the charging current I71 of the capacitor C71 for the period TCHG, so that $$I71=IR73$$

$$=VBE77/R73.$$

Therefore f7 becomes $$f7=I71/(2C71VBE72)$$

$$=(VBE77/R73)/(2C71VBE72),$$

and because VB77 can be taken to be equal to VBE77 at the IC, then $$f7=1/(2C71R73) \qquad (3).$$

That is, the center frequency f7 of the demodulation characteristic for the demodulating circuit 7 is decided by a capacitance of a capacitor and a resistance of a resistor.

As described above, with the receiver of FIG. 1, the oscillated frequency f15 of the second local oscillating circuit 15 and the central frequencies f5 and f7 of the bandpass filter 5 and the demodulating circuit 7 are decided by capacitance of capacitors and resistance of resistors, as shown in equations (1) to (3). Therefore, when a circuit is integrated into an IC, even if the oscillated frequency f15 and the center frequencies f5 and f7 vary due to differences in the capacitance of capacitors and resistance of resistors these will vary with the same tendency by the same fraction; i.e. they will vary together.

Good tracking characteristics are therefore obtained and the received frequency can be accurately decided simply by adjusting the first locally oscillated frequency ωo to the frequency of the target signal.

The tracking characteristics can be made better as the difference between the second locally oscillated frequency f15 and the center frequencies f5 and f7 of the bandpass filter 5 and demodulating circuit 7 is smaller, in other words, as the first intermediate frequency corresponding to this difference is smaller. In the above, the best tracking characteristic is obtained because of a first intermediate frequency being 0.

In the case of the numeric example above, relative differences in the second locally oscillated frequency f15 and the center frequencies f5 and f7 due to circuit integration are about ±1% to ±3%, which gives a tracking error with respect to the received frequency of ±1 kHz or less. With a narrow band FM signal for a cordless telephone, the passband of the intermediate frequency filter decided by the available bandwidth is 10 kHz to 15 kHz, which is permissible for this value.

Further, the receiver can be made smaller and more cheaply because it is not necessary to form the second locally oscillated signal S15 by using a crystal oscillating circuit or by multiplying the frequency of the oscillated signal of the crystal oscillating circuit for PLL 14. System design becomes also easier because it is not necessary to consider spurious disturbance characteristics.

Even if a minute shift occurs between the desired signal frequency and the actually received signal frequency, this is reduced by AFC to the second local oscillating circuit 15 and signals can be received without distortion.

In the above, the first intermediate frequency is 0 but there is no problem in practical terms if this is between from 0 to a few kHz. It is also preferable for the second intermediate frequency fs to be a frequency for which filter processing within the IC is possible, for example, a few tens of kHz or less.

The second local oscillating circuit 15, the bandpass filter 5 and the demodulating circuit can also be formed as other CR oscillating circuits and active filter circuits etc., if the oscillated frequency f15 and the central frequencies f5 and f7 for the second local oscillating circuit 15, the bandpass filter 5 and the demodulating circuit 7 can be decided by capacitance of capacitors and resistance of resistors. Further, when the received signal is an AM signal, the limiter amplifier 6 may be provided as a linear amplifier, the output of which may be AM detected.

According to this invention, a large portion of a circuit for a double superheterodyne receiver may be integrated into a single IC chip. Further, the receiver may be made more simply, smaller, and may be made more cheaply. Moreover, when integrated into an IC, differences in the absolute values of the capacitors and resistors due to variation in manufacturing processes may be eliminated to make this circuit suitable for integration.

What is claimed is:

1. A receiver apparatus comprising:
    first local oscillating means for generating a pair of first locally oscillated signals out of phase with each other by ninety degrees;
    a first pair of mixer circuits for mixing a received signal having a high frequency with said pair of first locally oscillated signals to produce a pair of first intermediate frequency signals having a relatively low frequency;
    second local oscillating means for generating a pair of second locally oscillated signals out of phase with each other by ninety degrees;
    a second pair of mixer circuits for mixing said pair of first intermediate frequency signals with said pair of second locally oscillated signals, respectively, to produce a pair of second intermediate frequency signals having a predetermined frequency;
    an adding circuit for adding said pair of second intermediate frequency signals to each other;
    a bandpass filter for receiving an output signal from said adding circuit; and
    a demodulation circuit for reproducing an original received signal from the output of said bandpass filter,
    wherein said second local oscillating means comprises a capacitor and a resistor connected to determine a second locally oscillated intermediate frequency and said bandpass filter comprises a capacitor and a resistor connected to determine a center frequency of said bandpass filter.

2. A receiver apparatus according to claim 1 wherein said demodulating circuit is an FM demodulating circuit and comprises a capacitor and a resistor connected to determine a center frequency of said demodulating circuit.

3. A receiver apparatus according to claim 1 comprising a single IC chip incorporating said capacitor and resistor determining said second locally oscillated intermediate frequency and said capacitor and resistor determining said center frequency of said bandpass filter.

4. A receiver apparatus according to claim 2 comprising a single IC chip incorporating said capacitor and resistor determining said second locally oscillated intermediate frequency, said capacitor and resistor determining said center frequency of said bandpass filter, and said capacitor and resistor determining said center frequency of said demodulating circuit.

5. A receiver apparatus according to claim 3 wherein change in the frequency of the received signal is carried out in accordance with a frequency change of said first locally oscillated signals.

6. A receiver apparatus according to claim 4 wherein change in the frequency of the received signal is carried out in accordance with a frequency change of said first locally oscillated signals.

7. A receiver apparatus according to claim 5 wherein said first local oscillating means comprises a phase-locked loop, further comprising an auto-frequency control circuit for auto-frequency controlling said second locally oscillated signals.

8. A receiver apparatus according to claim 6 wherein the first local oscillating means comprises a phase-locked loop, further comprising an auto-frequency control circuit for auto-frequency controlling said second locally oscillated signals.

* * * * *